(12) United States Patent
Lee

(10) Patent No.: US 7,314,807 B2
(45) Date of Patent: Jan. 1, 2008

(54) METHODS OF MANUFACTURING A METAL-INSULATOR-METAL CAPACITOR

(75) Inventor: Whan-Ki Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 197 days.

(21) Appl. No.: 11/231,497

(22) Filed: Sep. 21, 2005

(65) Prior Publication Data

US 2006/0134880 A1    Jun. 22, 2006

(30) Foreign Application Priority Data

Dec. 22, 2004    (KR) .................. 10-2004-0110630

(51) Int. Cl.
*H01L 21/20*    (2006.01)

(52) U.S. Cl. ...................... 438/396; 438/253
(58) Field of Classification Search ............... 438/396, 438/253
See application file for complete search history.

(56) References Cited

U.S. PATENT DOCUMENTS

2006/0134880 A1*    6/2006    Lee .......................... 438/396

* cited by examiner

*Primary Examiner*—Mark V. Prenty
(74) *Attorney, Agent, or Firm*—Andrew D. Fortney (57) ABSTRACT

Methods of manufacturing a metal-insulator-metal capacitor are provided. An illustrated method includes: forming a lower metal electrode layer pattern in a metal-insulator-metal capacitor region and a lower metal line layer pattern in a metal line region above an insulating layer above a semiconductor substrate; forming an intermetal insulating layer covering the lower metal electrode layer pattern and the lower metal line layer pattern; forming a first trench by removing a portion of the intermetal insulating layer in the metal-insulator-metal capacitor region, a portion of the intermetal insulating layer being left on the lower metal electrode layer pattern; forming a second trench exposing a portion of the lower metal electrode layer pattern by forming an insulating spacer layer on a sidewall of the first trench and removing the remaining intermetal insulating layer under the first trench; forming a dielectric layer over the entire upper surface of the resultant structure; forming a via hole exposing a portion of the lower metal line layer pattern of the metal line region using a predetermined mask layer pattern; and forming an upper metal electrode layer on the dielectric layer within the second trench and a via contact connected to the lower metal line layer pattern within the via hole.

6 Claims, 8 Drawing Sheets

METHODS OF MANUFACTURING A METAL-INSULATOR-METAL CAPACITOR

FIELD OF THE DISCLOSURE

The present disclosure relates generally to semiconductor fabrication and, more particularly, to methods of manufacturing a metal-insulator-metal (hereinafter, referred to as MIM) capacitor.

BACKGROUND

Figure 1:
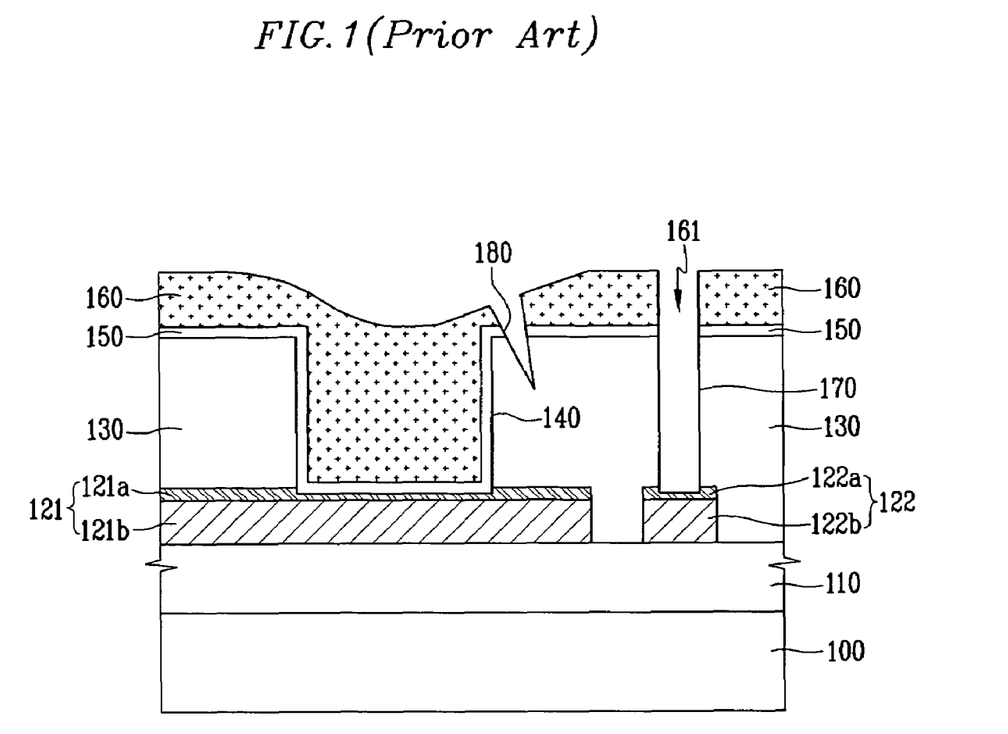
FIG. 1 is a cross-sectional view of a conventional metal-insulator-metal capacitor.

FIG. 1 is a cross-sectional view illustrating a conventional method of manufacturing a metal-insulator-metal capacitor.

Referring to FIG. 1, a lower metal electrode layer pattern 121 for a MIM capacitor and a lower metal line layer pattern 122 for a metal line are respectively formed on an insulating layer 110 on a semiconductor substrate 100. As an example, the lower metal electrode layer pattern 121 may include a TiN layer 121a and an Al layer 121b. The lower metal line layer pattern 122 may include a TiN layer 122a and an Al layer 122b. Although not shown in the drawing, the lower metal electrode layer pattern 121 and the lower metal line layer pattern 122 can be electrically connected to a lower metal line layer (not shown). An insulating layer 130 is then formed. Next, a trench 140 exposing the lower metal electrode layer pattern 121 in a MIM capacitor region is formed by an etching process using a predetermined mask layer pattern as an etching mask. Then, a dielectric layer 150 is formed over the entire upper surface of the resultant structure formed with the trench 140. A photoresist layer pattern 160 is formed over the dielectric layer 150 to form an etching mask layer pattern for forming a via hole. The photoresist layer pattern 160 includes an opening 161 exposing an upper surface of the dielectric layer 150 at which a via hole will be formed. A via hole 170 exposing the lower metal layer pattern 122 is formed by an etching process using the photoresist layer pattern 160 as an etching mask.

Although not shown in the drawing, the photoresist layer pattern 160 is removed after the formation of the via hole 170, and a metal layer (not shown) such as a tungsten layer is formed over the entire upper surface of the resultant structure after removing the photoresist layer pattern 160. In addition, if a planarization process is performed such that a surface of the dielectric layer 150 is exposed, an upper metal electrode layer is formed within the trench 140 in the MIM capacitor region, and a via contact is formed within the via hole 170 in a metal line region. Then, by performing deposition and patterning of a metal layer, an upper metal layer pattern, which is electrically connected to the via contact in the metal line region and the upper metal electrode layer in the MIM capacitor region, is formed by interposing a barrier metal layer.

However, such a conventional method of manufacturing the MIM capacitor may have the following problem. In the process of forming the photoresist layer pattern 160, a thickness of the photoresist layer pattern 160 at an upper edge portion of the trench 140 may be relatively thinner, because of the existence of the trench 140, than a thickness at other portions. In such a case, the portion of the photoresist layer pattern 160 near the upper edge portion of the trench 140 may be removed by the etching process for forming the via hole 170, thereby forming a groove 180 destroying the insulating layer 130. Furthermore, the groove 180 may penetrate the insulating layer 130 thereby exposing the lower metal electrode layer pattern 121. This problem may be solved by increasing the thickness of the photoresist layer pattern 160, but the high degree of integration of many semiconductor devices limits the amount the thickness of the photoresist layer pattern 160 may be increased.

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

FIG. 2 to FIG. 8 are cross-sectional views illustrating an example method of manufacturing a metal-insulator-metal capacitor performed in accordance with the teachings of the present invention.

Figure 2:
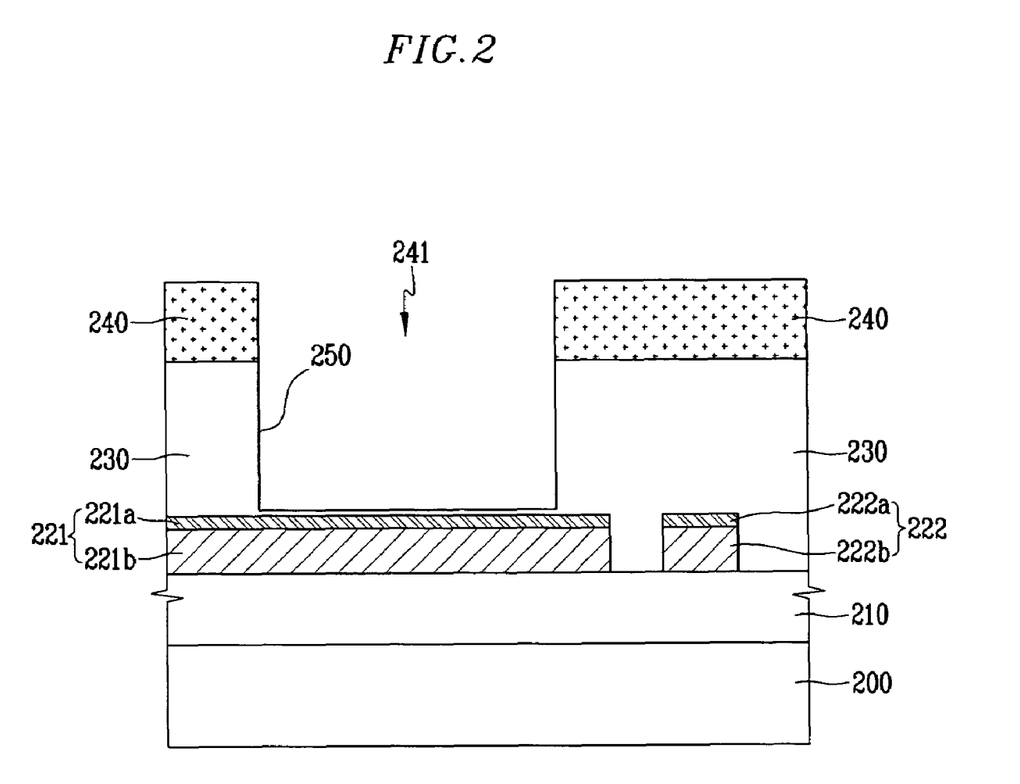
FIG. 2 to FIG. 8 are cross-sectional views illustrating an example method of manufacturing a metal-insulator-metal capacitor performed in accordance with the teachings of the present invention.

Referring to FIG. 2, a lower metal electrode layer pattern 221 for a MIM capacitor and a lower metal line layer pattern 222 for a metal line are respectively formed on an insulating layer 210 on a semiconductor substrate 200 such as a silicon substrate. Although not shown in the drawing, the lower metal electrode layer pattern 221 and the lower metal line layer pattern 222 may be electrically connected to a lower metal line layer (not shown). The lower metal electrode layer pattern 221 and the lower metal line layer pattern 222 may be formed as Al/TiN layers. For example, the lower metal electrode layer pattern 221 may include an Al layer 221b and a TiN layer 221a, and the lower metal line layer pattern 222 may include an Al layer 222b and a TiN layer 222a. However, the lower metal electrode layer pattern 221 and the lower metal line layer pattern 222 are not limited thereto. For example, a Cu layer may be used instead of an Al layer, and a TiN layer may be further formed at a lower portion thereof.

After forming the lower metal electrode layer pattern 221 and the lower metal line layer pattern 222, an intermetal insulating layer 230 is formed over the entire upper surface thereof. The intermetal insulating layer 230 may be formed, for example, as a TEOS (tetraethylorthosilicate) oxide layer, but it is not limited thereto. Further, the intermetal insulating layer 230 may be formed, depending on the circumstances, as a multi-layer including a plurality of insulating layers.

Subsequently, a first photoresist layer pattern 240 is formed on the intermetal insulating layer 230 as a first mask layer pattern. The first photoresist layer pattern 240 includes an opening 241 exposing an upper surface of the intermetal insulating layer 230 in a MIM capacitor forming region. Then, a first trench 250 is formed by performing an etching process using the first photoresist layer pattern 240 as an etching mask to thereby remove an exposed portion of the intermetal insulating layer 230. In the illustrated example, the etching process is performed such that the lower metal electrode layer pattern 221 in the MIM capacitor forming region is not exposed. That is, the etching process is performed such that a portion of the intermetal insulating layer 230 having a predetermined thickness is left to remain on the lower metal electrode layer pattern 221 in the MIM capacitor forming region. In the illustrated example, the thickness d of the remaining intermetal insulating layer 230 is less than or equal to about 300 Å.

After forming the first trench 250, the first photoresist layer pattern 240 is removed. For example, the first photoresist layer pattern 240 may be removed by performing a conventional ashing process.

Figure 3:
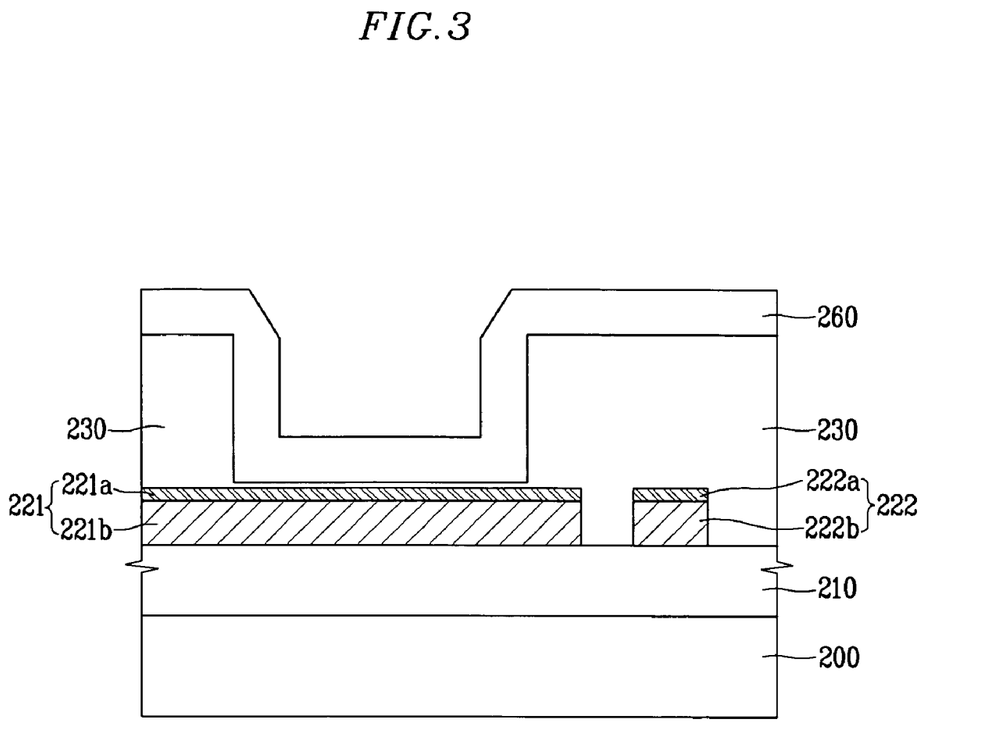

Referring to FIG. 3, an insulating layer 260 for forming an insulating spacer layer is formed over the entire upper surface of the structure of FIG. 2. In the illustrated example, the insulating layer 260 is formed as a TEOS oxide layer. The insulating layer 260 may be formed of the same material as the intermetal insulating layer 230, but it is not limited thereto.

Figure 4:
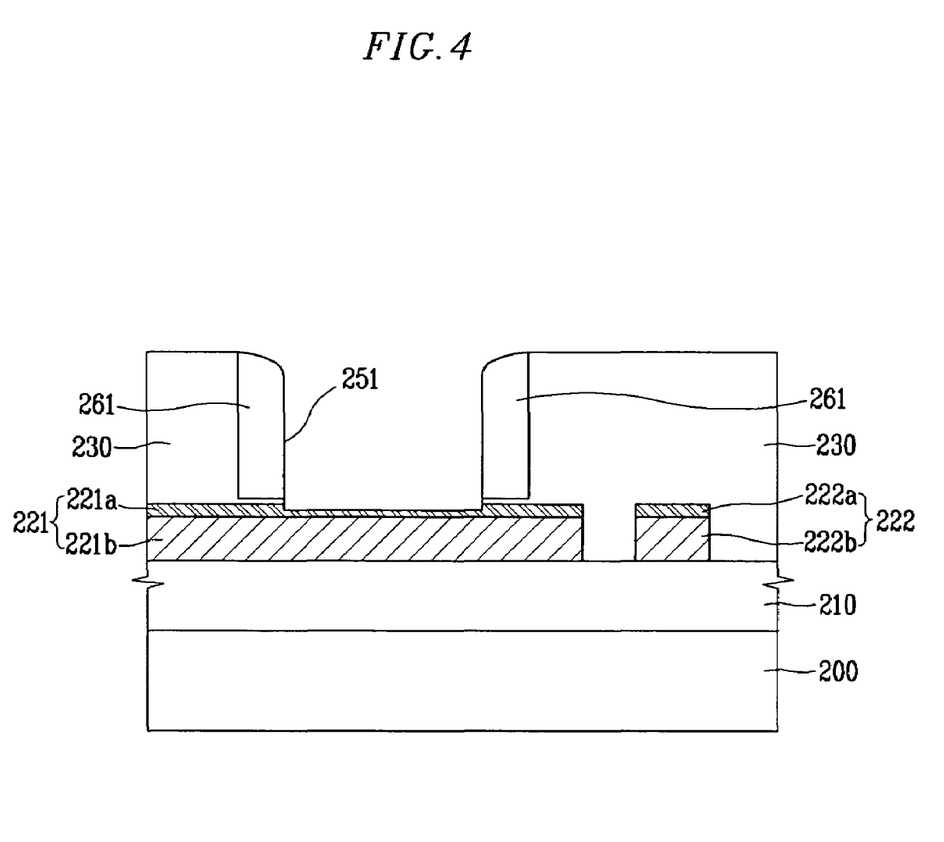

Referring to FIG. 4, an insulating spacer layer 261 is next formed on a sidewall of the first trench 250 by performing an anisotropic etching process such as an etch back process on the insulating layer designated by reference numeral 260 in FIG. 3. The etching process which forms the insulating spacer layer 261 also removes the portion of the intermetal insulating layer 230 remaining under the first trench 250, thereby exposing the lower metal electrode layer pattern 221. As a result of the etching process, a second trench 251 defined by the insulating spacer layer 261 is formed.

Figure 5:
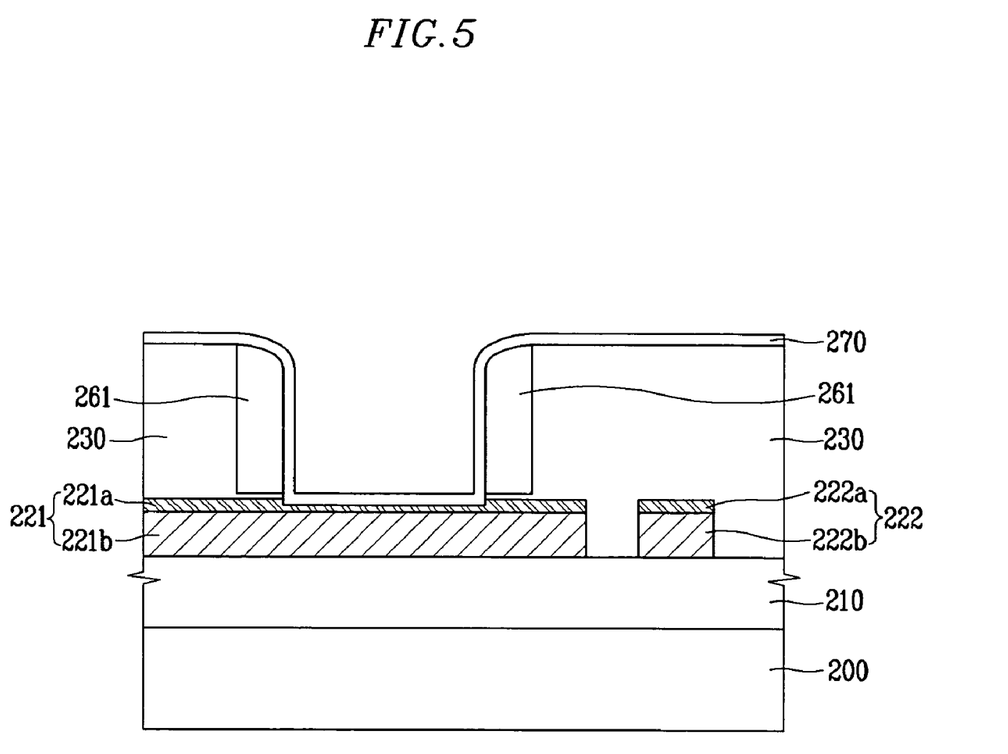

Referring to FIG. 5, a dielectric layer 270 is then formed over the entire upper surface of the structure of FIG. 4. In the illustrated example, the dielectric layer 270 is formed as a nitride layer.

Figure 6:
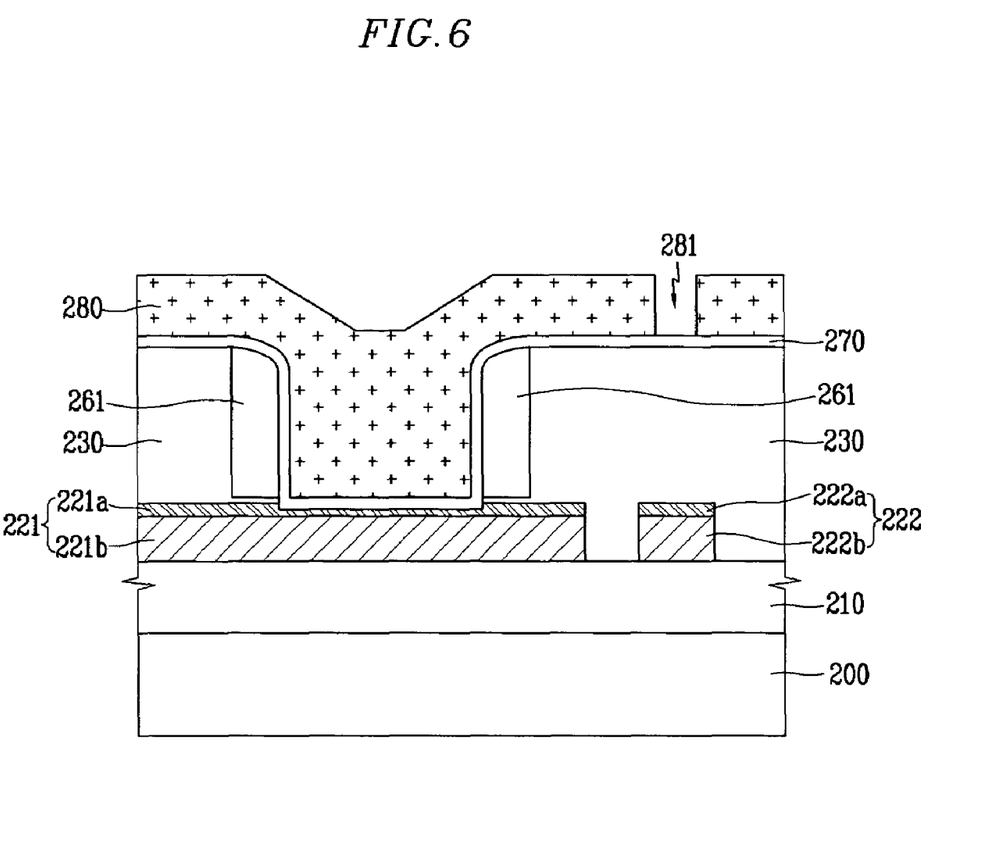

Referring to FIG. 6, a second photoresist layer pattern 280 is then formed on the dielectric layer 270. The second photoresist layer pattern 280 is formed to create a via hole for a metal line, and includes an opening 281 exposing a portion of the dielectric layer 270 in a region at which a metal line is to be formed. In the illustrated example, the second photoresist layer pattern 280 is formed to have a sufficient thickness even at an edge portion of the second trench 251, due to an inclined shape of an upper portion of the insulating spacer layer 261.

Figure 7:
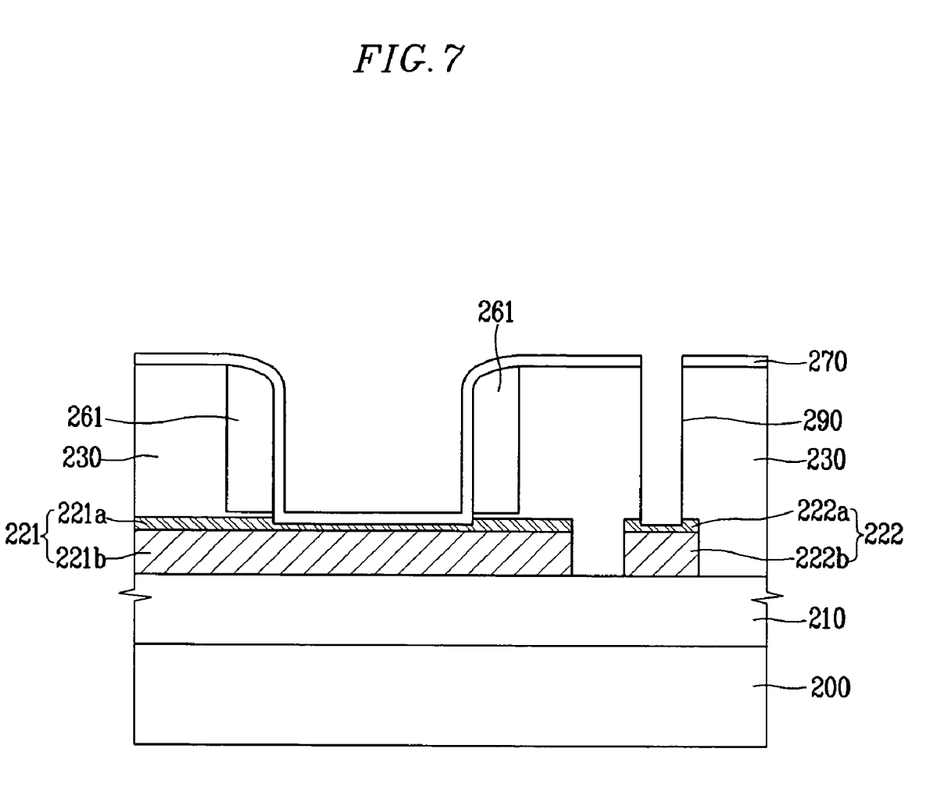

Referring to FIG. 7, an exposed portion of the dielectric layer 270 and a corresponding portion of the insulating layer 230 underneath the exposed portion of the dielectric layer 270 are sequentially removed by performing an etching process using the second photoresist layer pattern 280 as an etching mask. Accordingly, a via hole 290 exposing the lower metal line layer pattern 222 in the metal line region is formed. As stated above, since the second photoresist layer pattern 280 is formed in a sufficient thickness even at an upper edge portion of the second trench 251, the intermetal insulating layer 230 is protected from being damaged by the etching process used to form the via hole 290. After forming the via hole 290, the second photoresist layer pattern 280 is removed by a conventional ashing process.

Figure 8:
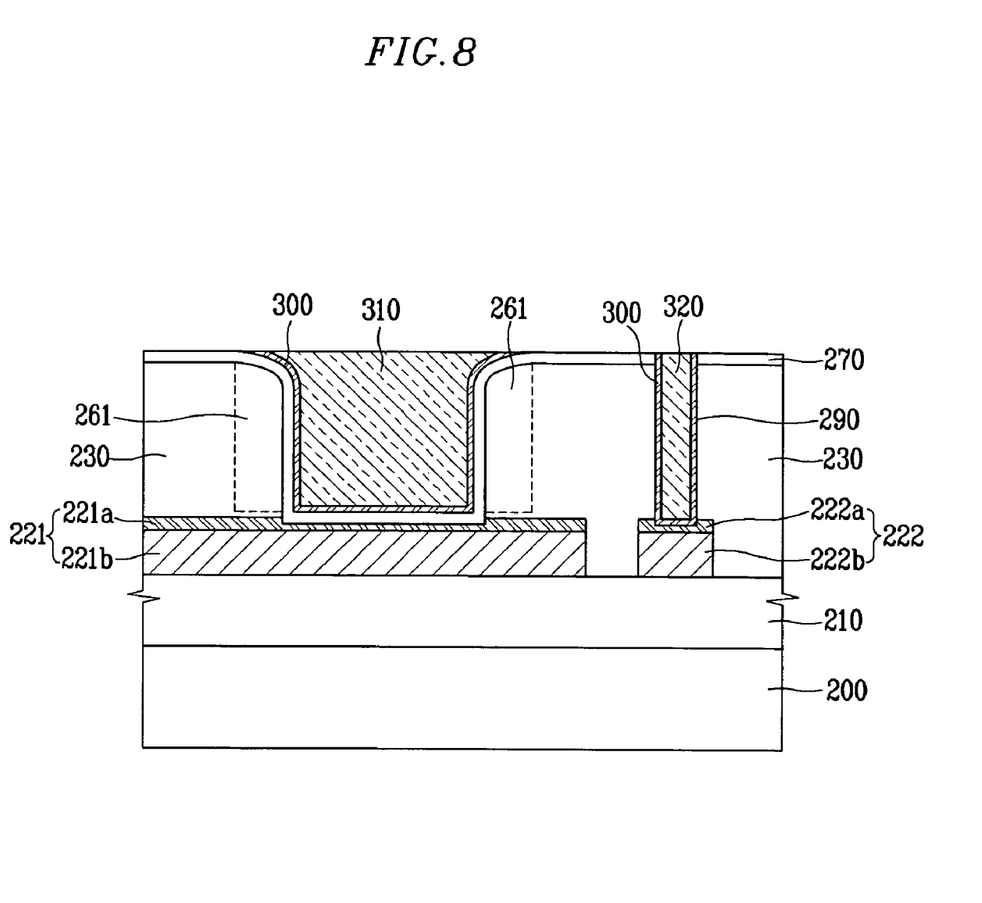

Then, referring to FIG. 8, a barrier metal layer 300 and a metal layer (not shown) are sequentially formed over the entire upper surface of the structure of FIG. 7. By performing a planarization process, an upper metal electrode layer pattern 310 of the MIM capacitor region and a via contact 320 of the metal line region are then formed. Accordingly, the lower metal electrode layer pattern 221, the dielectric layer 270, the barrier metal layer 300, and the upper metal electrode layer pattern 310 are sequentially disposed in the MIM capacitor region, thereby forming the MIM capacitor. Further, the metal line including the lower metal line layer pattern 222, the barrier metal layer 300, and the via contact 320 is formed in the metal line region. Then, although not shown in the drawing, an upper metal line structure is formed. The upper metal line structure may be electrically connected to each of the upper metal electrode layer pattern 310 and the via contact 320.

In the example method described above, a MIM capacitor is manufactured by forming the insulating spacer layer on a sidewall of the trench before forming the photoresist layer for forming the via hole of the metal line region. Therefore, damage to the intermetal insulating layer caused by the etching process for forming the via hole can be prevented.

From the foregoing, persons of ordinary skill in the art will appreciate that methods of manufacturing a MIM capacitor have been disclosed which prevent an insulating layer from being damaged by an etching process for forming a via hole near an upper edge of a trench for a MIM capacitor.

An example method of manufacturing a metal-insulator-metal capacitor includes: forming a lower metal electrode layer pattern in a metal-insulator-metal capacitor region and a lower metal line layer pattern in a metal line region on an insulating layer on a semiconductor substrate; forming an intermetal insulating layer covering the lower metal electrode layer pattern and the lower metal line layer pattern on the insulating layer; forming a first trench by removing the intermetal insulating layer in the metal-insulator-metal capacitor region, a portion of the intermetal insulating layer of a predetermined thickness being left on the lower metal electrode layer pattern; forming a second trench exposing a portion of the lower metal electrode layer pattern by forming an insulating spacer layer on a sidewall of the first trench and removing the remaining intermetal insulating layer under the first trench; forming a dielectric layer over the entire upper surface of the resultant structure; forming a via hole exposing the lower metal line layer pattern in the metal line region using a predetermined mask layer pattern; and forming an upper metal electrode layer on the dielectric layer within the second trench and forming a via contact connected to the lower metal line layer pattern within the via hole.

Forming the first trench may include: forming a first mask layer pattern having an opening exposing the intermetal insulating layer in the metal-insulator-metal capacitor region on the intermetal insulating layer; removing an exposed portion of the intermetal insulating layer by performing an etching process using the first mask layer pattern as an etching mask, (the portion of the intermetal insulating layer of the predetermined thickness remaining on the lower metal electrode layer pattern); and removing the first mask layer pattern.

The predetermined thickness may be less than or equal to 300 Å.

The insulating spacer layer may be formed as a TEOS oxide layer.

Forming an insulating spacer layer may include: forming an insulating layer for the insulating spacer layer on the intermetal insulating layer having the first trench; and performing an anisotropic etching process on the insulating layer until a surface of the metal electrode layer pattern in the metal-insulator-metal capacitor region is exposed.

Forming a via hole may include: forming a second mask layer pattern having an opening exposing the dielectric layer in the metal line region; forming the via hole exposing the lower metal line layer pattern by removing an exposed portion of the dielectric layer and the intermetal insulating layer by an etching process using the second mask layer pattern as an etching mask; and removing the second mask layer pattern.

It is noted that this patent claims priority from Korean Patent Application Serial Number 10-2004-0110630, which was filed on Dec. 24, 2004, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of manufacturing a metal-insulator-metal capacitor, comprising:

forming a lower metal electrode layer pattern in a metal-insulator-metal capacitor region above an insulating layer above a semiconductor substrate;

forming a lower metal line layer pattern in a metal line region above the insulating layer;

forming an intermetal insulating layer above the lower metal electrode layer pattern and the lower metal line layer pattern;

forming a first trench by removing a first portion of the intermetal insulating layer in the metal-insulator-metal capacitor region, a second portion of the intermetal insulating layer remaining above the lower metal electrode layer pattern in the metal-insulator-metal capacitor region;

forming an insulating spacer layer on a sidewall of the first trench and removing the remaining intermetal insulating layer under the first trench to form a structure including a second trench exposing a portion of the lower metal electrode layer pattern;

forming a dielectric layer above an upper surface of the structure;

using a first mask layer pattern to form a via hole exposing the lower metal line layer pattern in the metal line region;

forming an upper metal electrode layer on the dielectric layer within the second trench; and forming a via contact connected to the lower metal line layer pattern within the via hole.

2. A method as defined in claim 1, wherein forming the first trench comprises:

forming a second mask layer pattern above the intermetal insulating layer, the second mask layer pattern having an opening exposing the intermetal insulating layer in the metal-insulator-metal capacitor region;

performing an etching process using the second mask layer pattern as an etching mask to remove the first portion of the intermetal insulating layer; and removing the second mask layer pattern.

3. A method as defined in claim 1, wherein the second portion of the intermetal insulating layer has a thickness less than or equal to about 300 Å.

4. A method as defined in claim 1, wherein the insulating spacer layer is a TEOS oxide layer.

5. A method as defined in claim 1, wherein forming the insulating spacer layer comprises:

forming an insulating layer on the intermetal insulating layer; and performing an anisotropic etching process on the insulating layer until the portion of the metal electrode layer pattern in the metal-insulator-metal capacitor region is exposed.

6. A method as defined in claim 1, wherein using the first mask layer pattern to form the via hole comprises:

forming the first mask layer pattern, the first mask layer pattern having an opening exposing the dielectric layer in the metal line region;

removing an exposed portion of the dielectric layer and a portion of the intermetal insulating layer under the exposed portion of the dielectric layer, and removing the first mask layer pattern.

* * * * *